United States Patent [19]
Yeh

[11] Patent Number: 6,151,214
[45] Date of Patent: Nov. 21, 2000

[54] BEARING STRUCTURE OF A CENTRAL PROCESSING UNIT

[75] Inventor: Chih-Chiang Yeh, Taipei Hsien, Taiwan

[73] Assignee: First International Computer, Inc., Taipei, Taiwan

[21] Appl. No.: 09/318,764

[22] Filed: May 26, 1999

[51] Int. Cl.$^7$ ...................................................... H05K 7/20
[52] U.S. Cl. .......................... 361/695; 361/687; 361/692; 361/714; 361/717; 361/735; 361/764; 257/718; 257/723; 174/16.3; 174/252; 165/80.3; 165/185
[58] Field of Search ..................................... 361/688, 690, 361/687, 695, 702–705, 717–719, 735, 741, 752, 756, 760, 764, 767, 768, 789, 785, 790, 802, 816, 818; 257/706–727; 165/80.3, 185, 80.4; 174/52.4, 16.3, 252, 254, 260; 29/739, 740, 845; 439/66, 71, 74, 86–91

[56] References Cited

U.S. PATENT DOCUMENTS

| | | | |
|---|---|---|---|
| 4,849,856 | 7/1989 | Funari et al. | 361/386 |
| 5,838,064 | 11/1998 | Shimada | 257/718 |
| 5,880,930 | 3/1999 | Wheaton | 361/690 |
| 5,883,782 | 3/1999 | Thurston et al. | 364/704 |
| 5,901,039 | 5/1999 | Dehaine . | |

FOREIGN PATENT DOCUMENTS 404186752  11/1990  Japan ............................... H05K 7/20

*Primary Examiner*—Lynn D. Feild
*Assistant Examiner*—Michael Datskorsky
*Attorney, Agent, or Firm*—Rosenberg, Klein & Lee

[57] ABSTRACT

Disclosed is a bearing structure of a central processing unit comprises a radiating plate, a back plate, a plurality of screws and elastic elements. The radiating plate has a heat conductive portion and a plurality of sleeves. The back plate is installed below the radiating plate and has a plurality of studs. The plurality of screws are placed within the sleeves of the radiating plate, and protrudes from the bottom of the radiating plate. The plurality of elastic elements being installed between the screws and the sleeve. The radiating plate is moved by the elastic elements so that the heat conductive portion of the radiating plate presses elastically the central processing unit. Therefore, the pressure will not be too large so as to harm the central processing unit, or too small so as to cause the unfastening therebetween. As a result, during assembly, the fastening force of the screws would not be adjusted. Thus, the assembly work becomes easily and the cost is reduced.

7 Claims, 6 Drawing Sheets

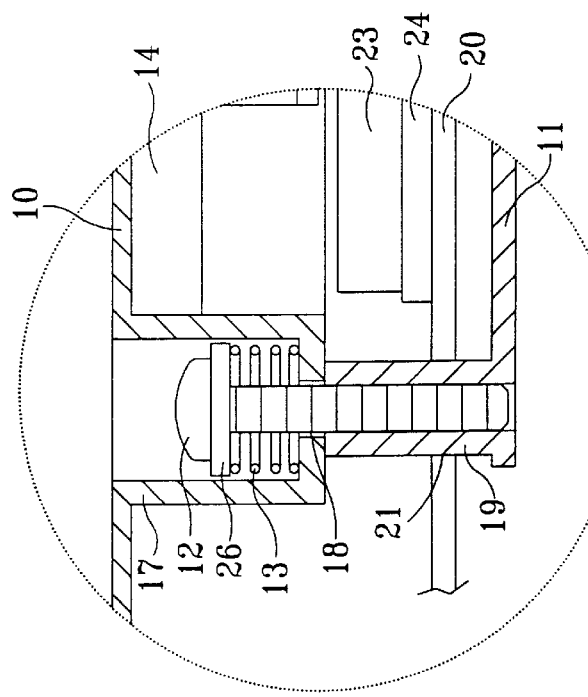
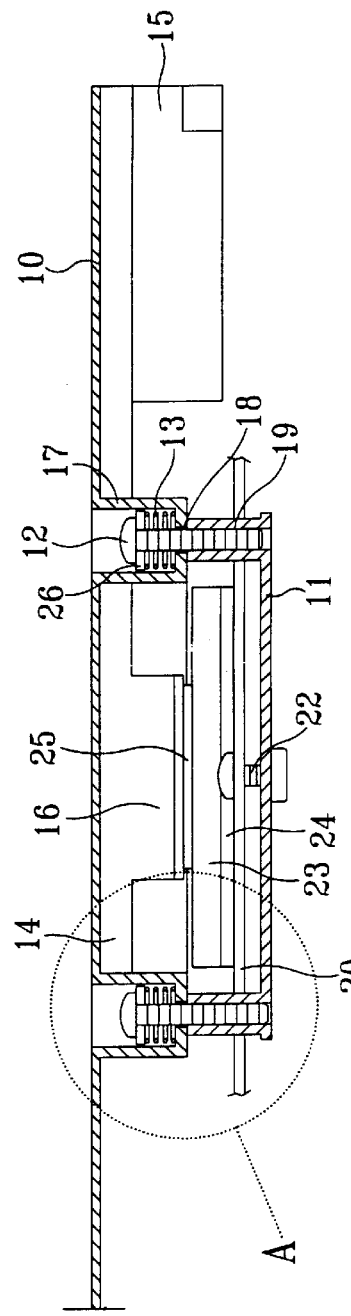
FIG. 4A
FIG. 4

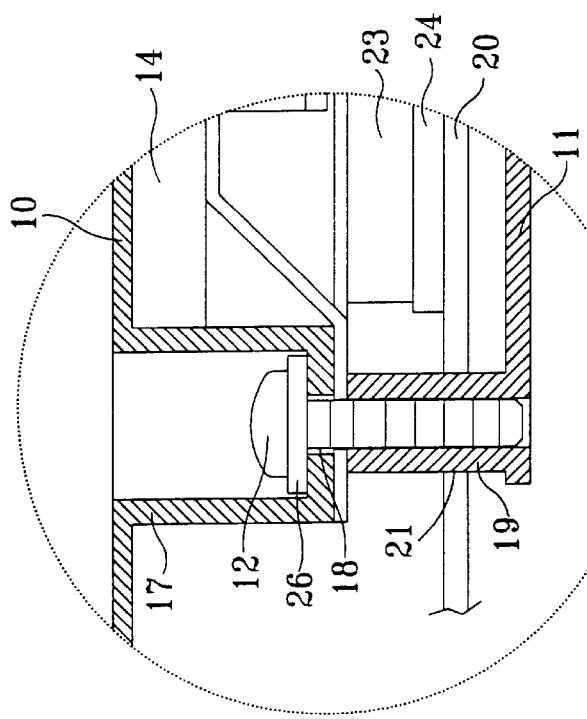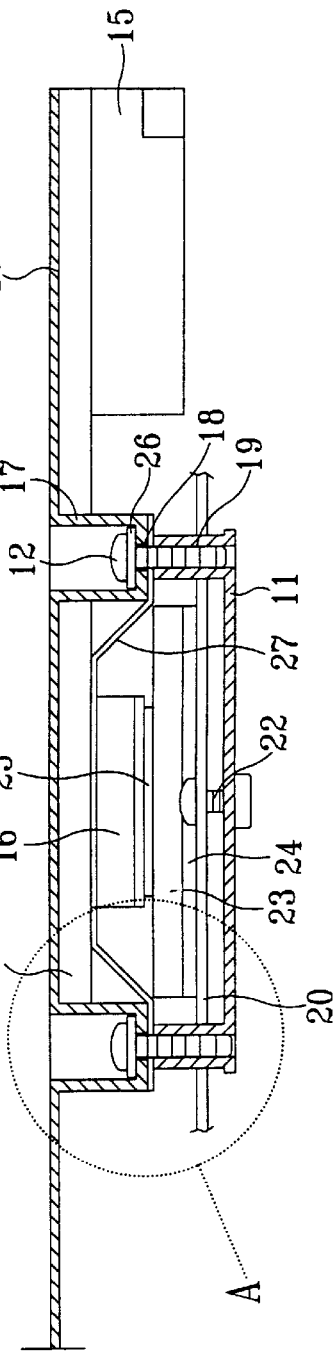

BEARING STRUCTURE OF A CENTRAL PROCESSING UNIT

BACKGROUND OF THE INVENTION

1. Field of the Invention

The present invention relates a bearing structure of a central processing unit, and especially to a bearing structure suitable for a notebook computer, wherein the central processing unit and the radiating plate are connected properly.

2. Description of the Prior Art

In the bearing structure of the central processing unit of a notebook computer, the central processing unit is screwedly locked to the radiating plate made of metal to dissipate heat through the radiating plate. However, in this prior art locking way, the pressure applied to the central processing unit is performed through screw, thus, the locking force of the screw is too large, so that the central processing unit is probably destroyed. If the locking force of the screw is too small, a loose locking is formed. Therefore, during assembly, the locking force of the screw is necessary to be adjusted. However, this action is time-consuming and costly.

SUMMARY OF THE INVENTION

Accordingly, the object of the present invention is to provide a bearing structure of a central processing unit comprises a radiating plate, a back plate, a plurality of screws and elastic elements. The radiating plate has a heat conductive portion and a plurality of sleeves. The back plate is installed below the radiating plate and has a plurality of studs. The plurality of screws are placed within the sleeves of the radiating plate, and protrudes from the bottom of the radiating plate. The plurality of elastic elements being installed between the screws and the sleeve. The radiating plate is moved by the elastic elements so that the heat conductive portion of the radiating plate presses elastically the central processing unit. Therefore, the pressure will not be too large so as to harm the central processing unit, or too small so as to cause the unfastening therebetween. As a result, during assembly, the fastening force of the screws would not be adjusted. Thus, the assembly work becomes easily and the cost is reduced.

The present invention will be better understood and its numerous objects and advantages will become apparent to those skilled in the art by referencing to the following drawings in which:

BRIEF DESCRIPTION OF THE DRAWINGS

FIG. 4 is a cross sectional view of the present invention.

FIG. 4A is an exploded view of a portion of FIG. 4.

FIG. 6 is a cross sectional view of another embodiment of the present invention.

FIG. 6A is an enlarged view of a portion of FIG. 6.

DETAILED DESCRIPTION OF THE PREFERRED EMBODIMENT

Figure 1:
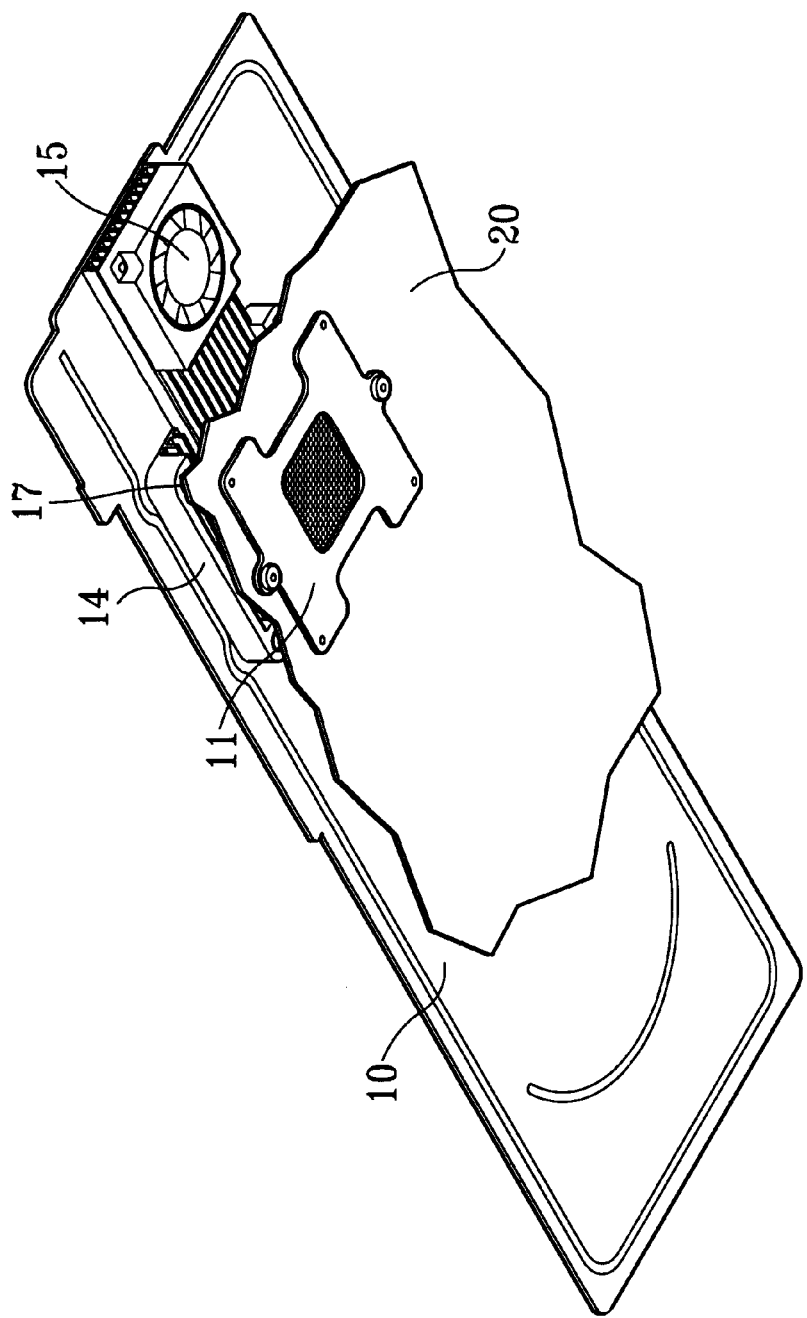
FIG. 1 is the perspective view of the present invention.
Figure 2:
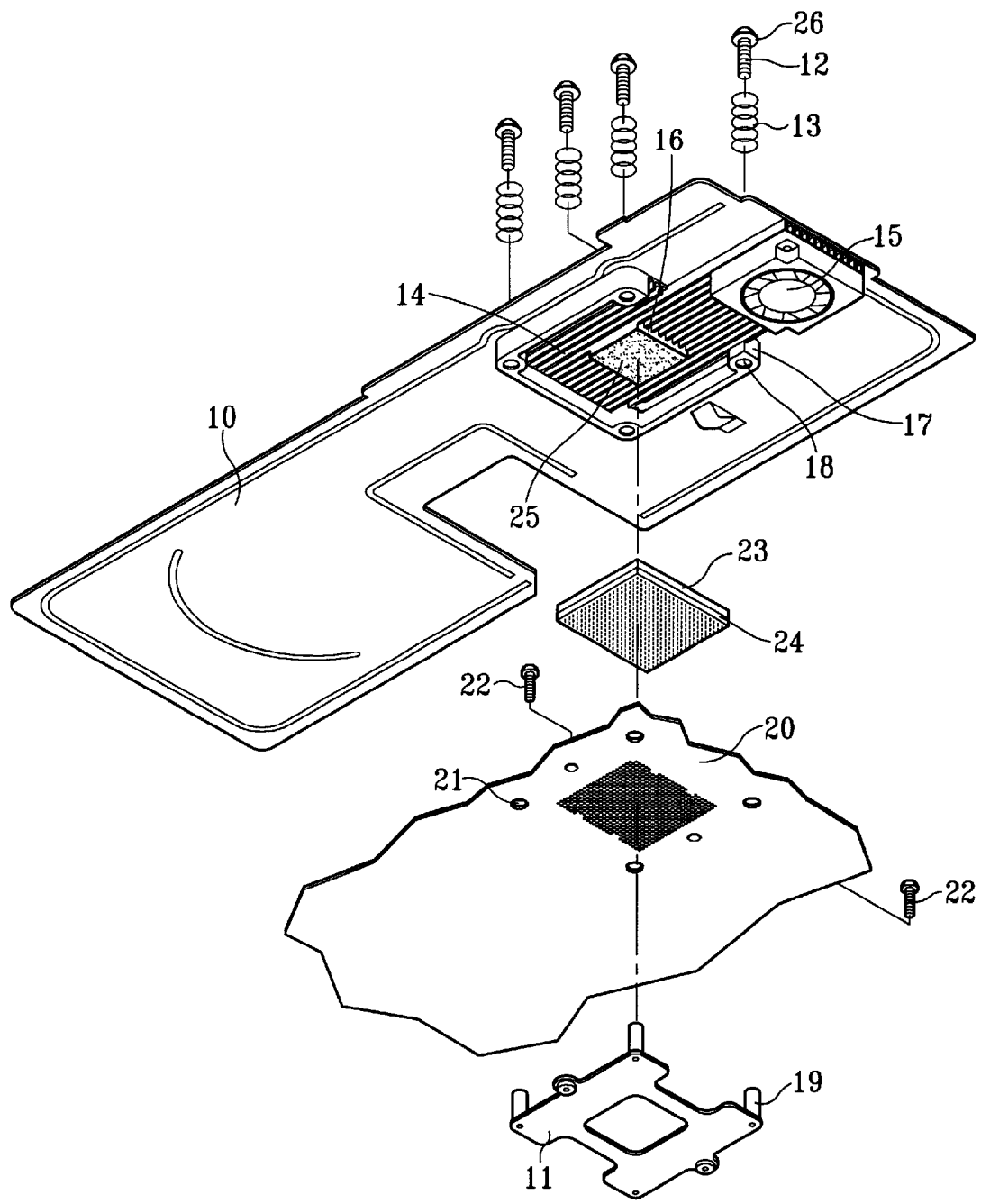
FIG. 2 is an exploded perspective view of the present invention.
Figure 3:
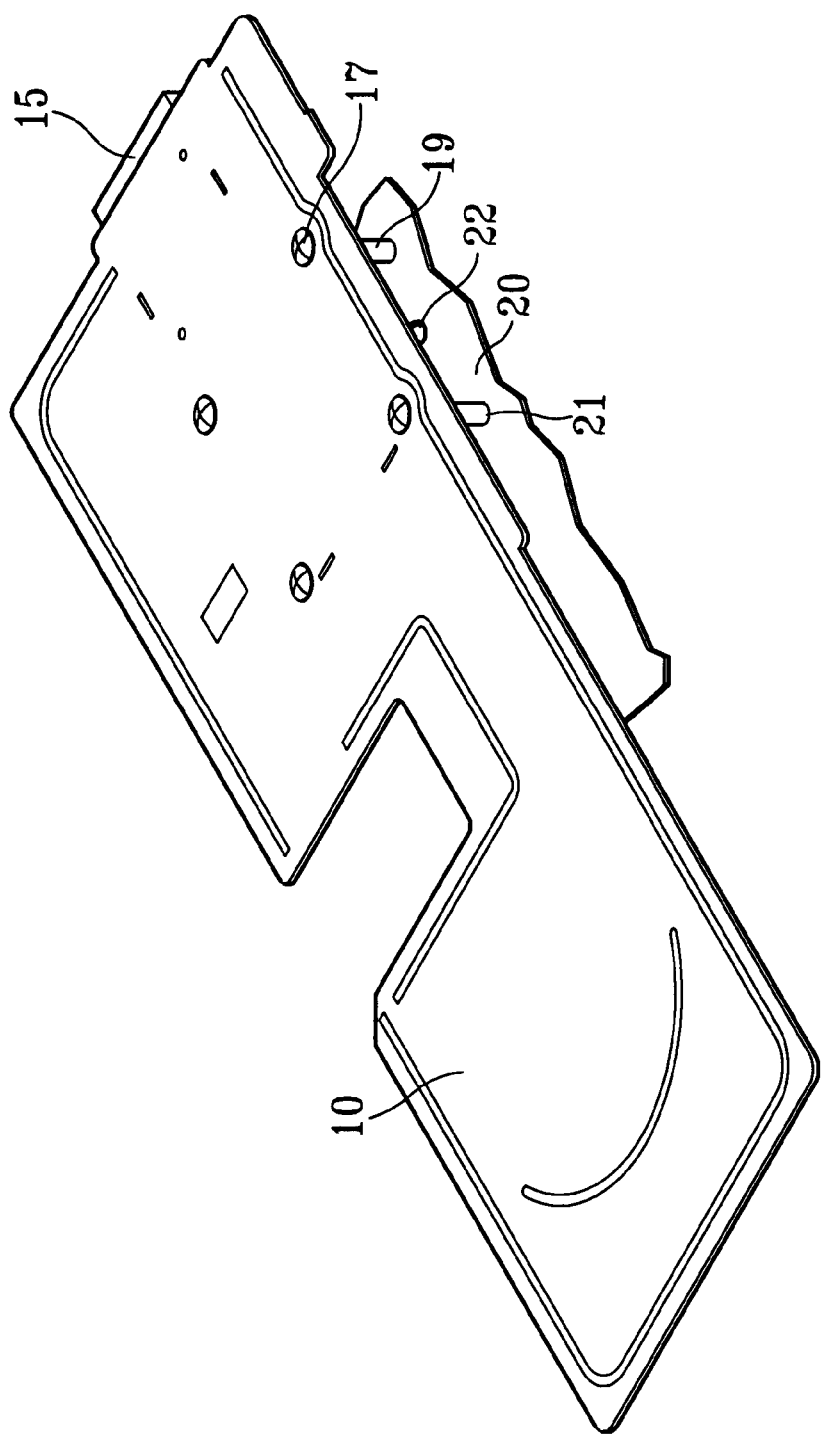
FIG. 3 is a perspective view of the present invention viewed from another orientation.

With reference to FIGS. 1–4A, a bearing structure of a central processing unit of the present invention is illustrated, especially the bearing structure of the present invention is suitable for a notebook computer. The bearing structure according to the present invention includes a radiating plate 10, a back plate 11, a plurality of screws 12 and elastic elements 13. The radiating plate 10 is made of metal and other material with preferred conductivity and is installed within the mother board of a computer. The bottom of the radiating plate 10 may be arranged with a radiator 14 and a fan 15 for heat dissipation. A heat conductive portion 16 is protruded from the bottom of the radiating plate 10. A plurality of (four) sleeves 17 are disposed around the periphery of the conductive portion 16 of the radiating plate 10. The top of each sleeve 17 has an opening 17, while the bottom thereof is formed with a respective through hole 18.

The back plate 11 is installed below the radiating plate 10 and has an approximately rectangular shape. Four corners of the back plate 11 are installed with respective stud 19. The screws 12 are arranged within the sleeves 17 of the radiating plate 10. The elastic elements 13 are a kind of compressible spring. Each elastic element 13 is installed between the screws 12 and the sleeve 17. A washer 26 is arranged between each elastic element 13 and screw 12. The lower end of the screw 12 protrudes form the bottom of the sleeve 17 from the through hole 18 and then is screwed to be connected to the stud 19. Thus, the back plate 11 is combined to the bottom of the radiating plate 10.

The mother board 20 is installed between the radiating plate 10 and the back plate 11. A through hole 21 is preset on the mother board 20 for being penetrating by the stud 19. The mother board 20 and the back plate 11 are attached together by two screws 22 so that the back plate 11 can be fixed inside the mainframe. A base 24 is inserted to the mother board 20. A central processing unit 23 is inserted to the base 24, and thus the central processing unit 23 is fixed to the mother board 20. The top of central processing unit 23 is connected to the heat conductive portion 16 at the bottom of the radiating plate 10 through heat conductive glue 25. Thereby, the heat from the central processing unit 23 can be transferred to the radiating plate 10. The back plate of a central processing unit is formed by aforementioned components.

In the present invention, an elastic element 13 is installed between each screw 12 and the radiating plate 10, By the elastic force of the elastic element 13, the radiating plate 10 is pushed to move downwards so that the heat conductive portion 16 at the bottom of the radiating plate 10 will press against the mother board 23 by the elastic force thereof. The radiating plate 10 and the heat conductive portion 16 may moves elastically. Thereby, the heat conductive portion 16 of the radiating plate 10 may elastically press the central processing unit 23. Therefore, the pressure will not be too large so as to harm the central processing unit, or too small so as to cause an unfastening therebetween. Therefore, during assembly, the fastening force of the screws 12 would not be adjusted. Thus, the assembly work becomes easily.

Figure 5:
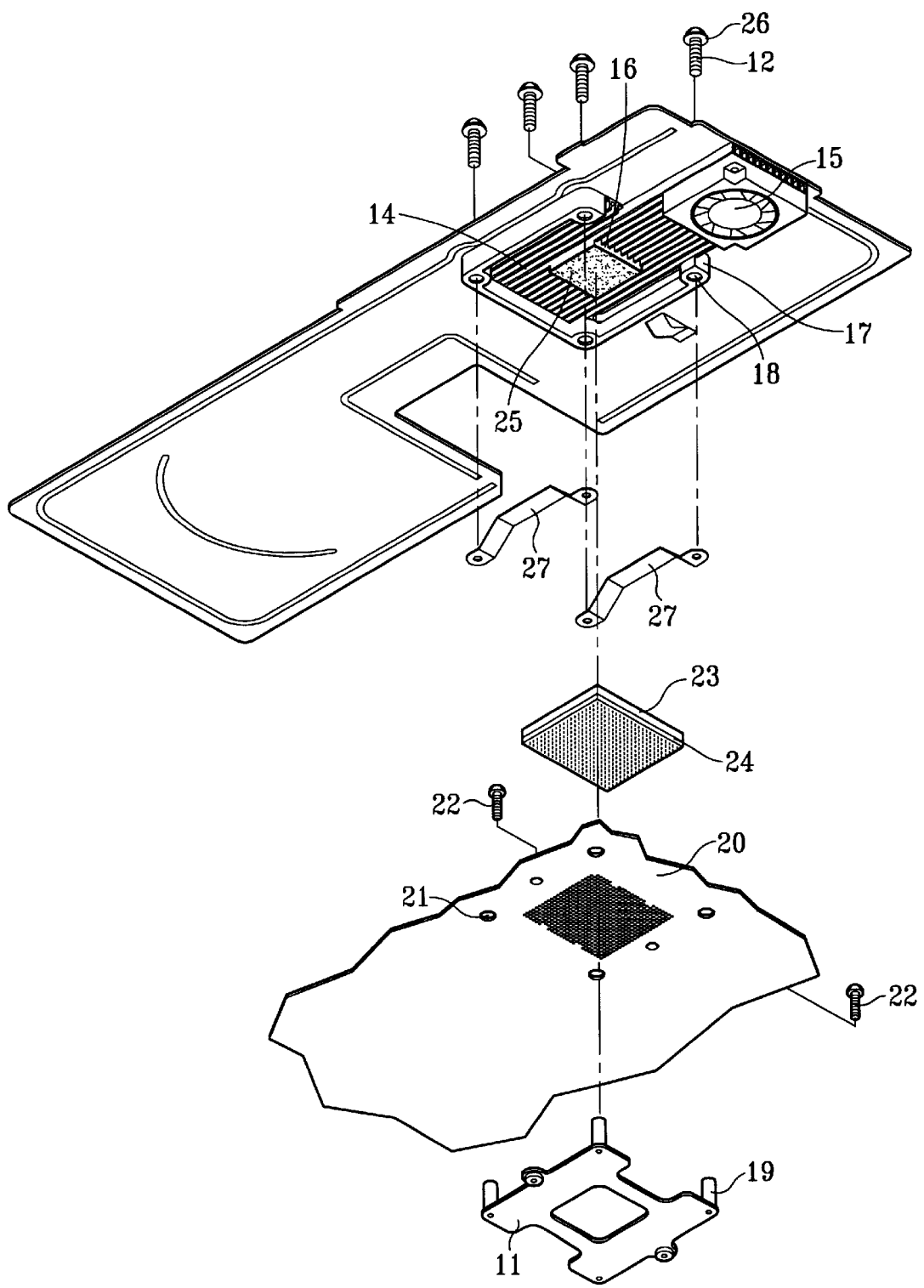
FIG. 5 is an exploded perspective view of another embodiment according to the present invention.

Moreover, as shown in FIGS. 5, 6 and 6A, the elastic element 27 is a kind of elastic piece. Two arc shape elastic elements 27 are installed between the radiating plate 10 and the back plate 11. The lower ends of the screws 12 protrudes from the bottom of the sleeve 17 through the through holes 18 and the pass through the two ends of the elastic elements 27, and then is screwedly connected to the stud 19 of the back plate Accordingly, by the bearing structure of the present invention, the defect in the prior art such as destroy of a central processing unit, unfastening, and time-consuming during assembly, can be resolved by the present invention.

Although the present invention has been described using specified embodiment, the examples are meant to be illustrative and not restrictive. It is clear that many other variations would be possible without departing from the basic approach, demonstrated in the present invention.

What is claimed is:

1. A bearing structure of a central processing unit, comprising:

a radiating plate, a heat conductive portion being installed thereon, a plurality of sleeves being installed on the radiating plate, a lower portion of each sleeve being formed with a through hole, and a bottom of the sleeve protruding from a bottom of the radiating plate;

a back plate arranged below the radiating plate, a plurality of studs being arranged on the back plate;

a plurality of screws arranged within the sleeves of the radiating plate, each screw protruding from the bottom of a respective sleeve from the through hole and then screwedly connected to a corresponding stud of the back plate, the bottom of each sleeve being in contact with a top portion of a respective stud;

a plurality of elastic elements each being installed between a head portion of a respective screw and the bottom of the sleeve; and a mother board arranged between the radiating plate and the back plate, a central processing unit being installed on the mother board, the central processing unit being connected to the heat conductive portion of the radiating plate through a heat conductive glue.

2. The bearing structure of a central processing unit according to claim 1, wherein a radiator is installed at the radiating plate.

3. The bearing structure of a central processing unit according to claim 1, wherein a fan is installed on the radiating plate.

4. The bearing structure of a central processing unit according to claim 1, wherein the elastic element is a compressible spring.

5. The bearing structure of a central processing unit according to claim 1, wherein a washer is arranged between the elastic element and the screw.

6. The bearing structure of a central processing unit according to claim 1, wherein the bottom of each sleeve of the radiating plate has a through hole, each screw passes through the bottom of the sleeve through the through hole.

7. The bearing structure of a central processing unit according to claim 1, wherein the mother board is designed with through holes for being penetrated by studs, the mother board and the back plate are locked together by screws.

* * * * *